United States Patent [19]

Fukushima et al.

[11] 4,424,582
[45] Jan. 3, 1984

[54] SEMICONDUCTOR MEMORY DEVICE

[75] Inventors: Toshitaka Fukushima, Yokohama; Kazumi Koyama, Kanagawa; Kouji Ueno; Tamio Miyamura, both of Kawasaki; Yuichi Kawabata, Kawasaki, all of Japan

[73] Assignee: Fujitsu Limited, Kanagawa, Japan

[21] Appl. No.: 141,931

[22] Filed: Apr. 21, 1980

[30] Foreign Application Priority Data

Apr. 27, 1979 [JP] Japan .................................. 54-52125

[51] Int. Cl.³ .............................................. G11C 7/00
[52] U.S. Cl. ................................................... 365/189
[58] Field of Search ....................... 365/189, 184, 218; 307/463

[56] References Cited

U.S. PATENT DOCUMENTS

| | | | |
|---|---|---|---|
| 3,588,851 | 6/1971 | Jordan, Jr. ........................... | 365/243 |
| 3,611,318 | 10/1971 | Heightley ............................ | 307/463 |
| 3,898,630 | 8/1975 | Hansen et al. ...................... | 365/218 |

*Primary Examiner*—James W. Moffitt
*Attorney, Agent, or Firm*—Staas & Halsey

[57] ABSTRACT

A semiconductor memory device which writes information by rendering particular memory cells conductive or non-conductive, wherein, when a selected memory cell is to be read out, a power supply voltage is applied to the collector of a transistor which feeds a base current to a final stage transistor of a decoder circuit which is connected to word lines, and when information is to be written in, a voltage higher than the power supply voltage is applied to the same collector.

18 Claims, 4 Drawing Figures

SEMICONDUCTOR MEMORY DEVICE

BACKGROUND OF THE INVENTION (1) Field of the Invention

The present invention relates to a semiconductor memory device, and more specifically to a decoder circuit of a semiconductor device which writes information by causing selected memory cells such as PROM (programmable read only) memory cells, to be conductive (short circuited) or non-conductive (opened).

(2) Description of the Prior Art

The programmable read only memory usually includes address inverters, decoders, memory cells, multiplexers, output buffers and a programming circuit. The memory cells are either of the junction type, in which the emitter-base junctions are connected to intersecting points of word lines and bit lines so that the junctions are short-circuited by the heat generated by a writing current, or of the blown-fuse type, in which a region of evaporated metal or polycrystalline silicon is melted and cut by the writing current.

With such a semiconductor memory device, the address inverters, memory cells, decoder circuits, multiplexers, and output buffers must be simplified and reduced in size with the increase in the memory capacity.

The semiconductor memory device which employs programmable read only memory cells operates on such greatly different writing current levels and reading current as, for example, 200 mA and 0.5 mA. In such a programmable read only memory, if a current which is enough to drive a writing current is fed to the base of a transistor which drives a reading current when the information is being read out, the transistor is saturated and electric charges accumulate in its base. Therefore, an extended period of time is required to render the transistor non-conductive; i.e., the circuit is not suited for high-speed operation. In order to ameliorate the above problem, therefore, a conventional decoder circuit has been employed which uses a feedback circuit having a diode to supply a suitable base current to the above-mentioned transistor when information is to be written in and read out (refer to ELECTRONICS DIGEST, Practical Application of IC Memory PROM, pp. 2-7, August, 1974, that was published in Japan).

Provision of the feedback circuit, however, makes wiring complicated, and is not desirable from the standpoint of highly integrating the circuits. Furthermore, the feedback circuit is not adequate for high-speed operation. Instead of providing the feedback circuit, one might consider switching over the power supply between reading and writing. However, since the power supply must feed a voltage not only to the decoder circuit but also to other circuits, it is difficult to switch over the power supply in view of design requirements for other circuits.

OBJECTS AND SUMMARY OF THE INVENTION

The object of the present invention is to provide a semiconductor memory device which eliminates the above-mentioned defects inherent in the conventional art, which features a simply constructed circuit setup, and which makes it possible to highly integrate the circuits.

Another object of the present invention is to provide a semiconductor memory device which is capable of being operated at high speeds.

In order to achieve the above objects, the present invention discloses a semiconductor memory device which comprises an address buffer which receives address signals, address signal lines which will be set to levels corresponding to the address signals by the output of the address buffer, a decoder circuit which decodes outputs of the address signals, and memory cells which will be rendered conductive or non-conductive in accordance with write information, wherein when a memory device is in the state, the current which feeds a base current to a transistor in a final stage of the decoder circuit to drive a selected word line is fed at power supply voltage, and when the device is in write state, the current is fed through a source whose voltage is higher than power supply voltage.

Further features and advantages of the present invention will become apparent from the ensuing description with reference to the accompanying drawings to which, however, the scope of the invention is in no way limited.

DESCRIPTION OF THE PREFERRED EMBODIMENT

Figure 1:
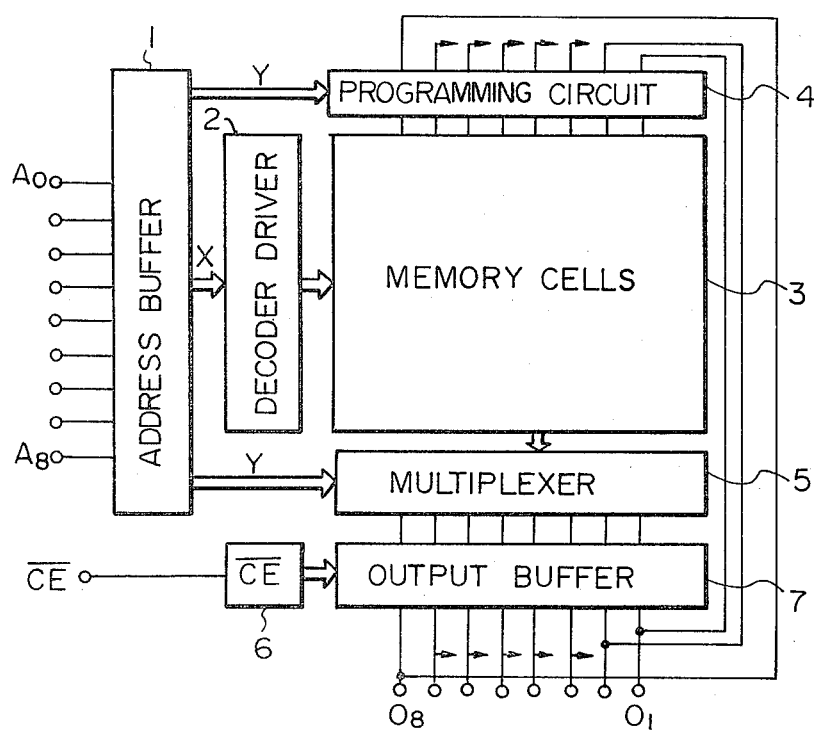
FIG. 1 is a block diagram illustrating a conventionally employed semiconductor memory device.

In general, a programmable read only memory consists of, as illustrated in FIG. 1, an address buffer 1 which receives address signals $A_0$ to $A_8$, a decoder driver 2 which decodes the output of the address buffer 1, memory cells 3, a programming circuit 4 which introduces information in the direction Y of the address buffer 1 and which feeds an output to the memory cells 3, a multiplexer 5 which transmits information in the direction Y of the memory cells 3, a CE (chip enable) circuit 6 which introduces chip enable signals, and an output buffer 7 which introduces the output of the CE circuit as well as the content of the multiplexer 5.

Figure 2:
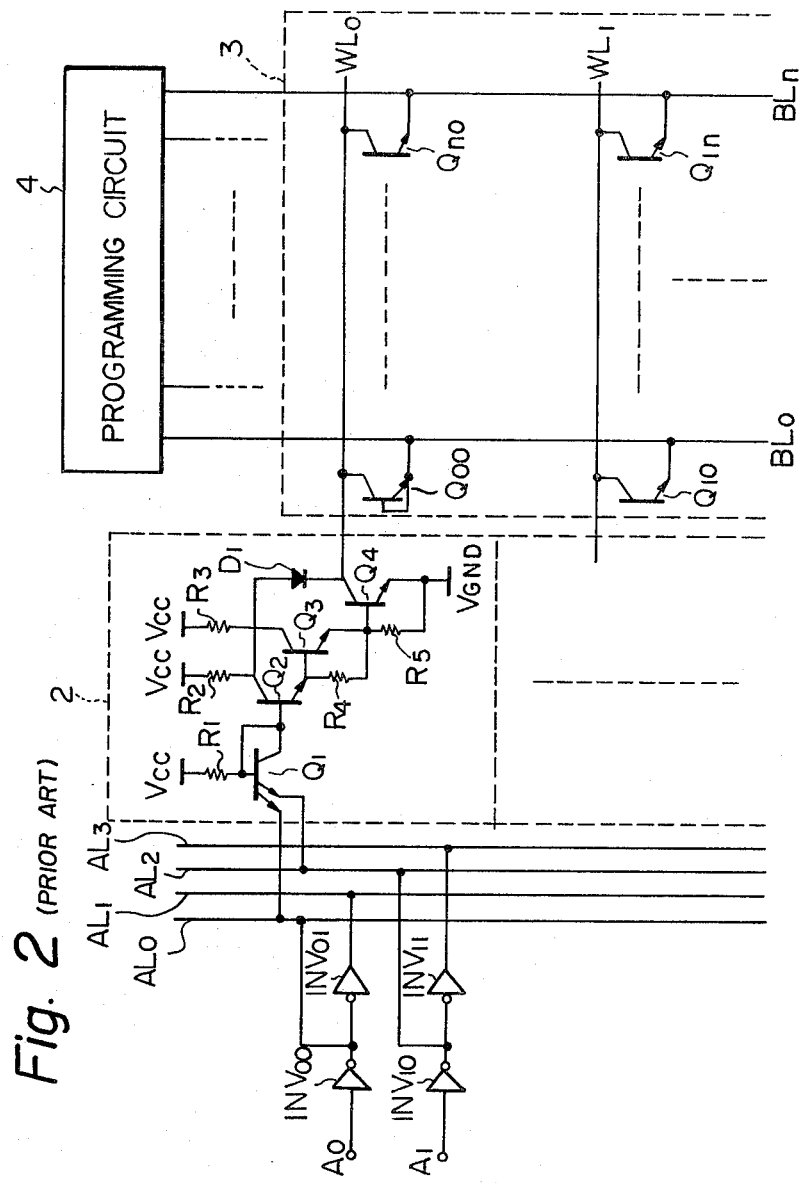
FIG. 2 is a circuit diagram of a conventional semiconductor memory device.

FIG. 2 is a partial circuit diagram of a conventional semiconductor memory device, and particularly, a partial circuit diagram of a junction-type programmable read only memory.

In FIG. 2, symbols $INV_{00}$ to $INV_{11}$ denotes address inverters, $AL_0$ to $AL_3$ denote address signal lines, 2 denotes a decoder driver circuit, $Q_1$ to $Q_4$ denote transistors, $R_1$ to $R_5$ denote resistors, $D_1$ denotes a diode, 4 denotes a programming circuit, 3 denotes a memory cell unit, $Q_{00}$ to $Q_{1n}$ denote memory cells, $WL_0$, $WL_1$—denote word lines, and $BL_0$ to $BL_n$ denote bit lines.

The writing operation of the circuit is described below with reference to the case where information is to be written down by short-circuiting the emitter-base junction of a memory cell $Q_{00}$ in the memory cell unit 3.

When address signals are fed to input terminals $A_0$ and $A_1$ of the inverters $INV_{00}$ and $INV_{10}$, the address signal lines $AL_0$ to $AL_3$ are set to levels that correspond to the signal levels fed to the input terminals $A_0$ and $A_1$.

Namely, when the terminal $A_0$ assumes a low level and the terminal $A_1$ assumes a low level, the address signal line $AL_0$ assumes a high level, the address signal line $AL_1$ assumes a low level, the address signal line $AL_2$ assumes a high level, and the address signal line $AL_3$ assumes a low level. The emitters of a multi-emitter transistor $Q_1$ of a decoder driver which is connected to word line $WL_0$ are connected to the address signal lines $AL_0$ and $AL_2$. Therefore, the transistor $Q_1$ is rendered non-conductive, and a base current is supplied from a power supply $V_{CC}$ to the transistor $Q_2$ via resistor $R_1$. Accordingly, the transistor $Q_2$ is rendered conductive, and the transistors $Q_3$ and $Q_4$ are also rendered conductive to select the word line $WL_0$. In this case, a writing current of about 200 mA is supplied to the memory cell $Q_{00}$, via a path $BL_0$-$Q_{00}$-$Q_4$-$V_{GND}$, to a short-circuit the emitter-base junction of memory cell $Q_{00}$. In the writing state the base current of transistor $Q_4$, which must sink a writing current of about 200 mA, is supplied through the transistors $Q_2$ and $Q_3$ of the decoder circuit.

Next, the reading operation of the circuit is described below with reference to the memory cell $Q_{00}$, in which the emitter-base junction is assumed to be short-circuited as shown in FIG. 2.

Information can be read out by detecting whether or not a current flows into the transistor $Q_4$ through the memory cell $Q_{00}$. When a low level voltage is applied to the terminal $A_0$ and terminal $A_1$, the word line $WL_0$ is selected, whereby the transistor $Q_1$ is rendered non-conductive and the transistors $Q_2$, $Q_3$ and $Q_4$ are rendered conductive, in the same manner as mentioned in discussing the writing state. In the reading state, there is no need for applying such a strong current as is applied in the writing state. A reading current of about 0.5 mA, which is two to three orders smaller than the writing current, flows into the bit line $BL_0$ and word line $WL_0$ through a path $BL_0$-$Q_{00}$-$Q_4$-$V_{GND}$. In the writing state, a current of about 200 mA is sinked in transistor $Q_4$, collector potential of the transistor $Q_4$ is sustained high, and the diode $D_1$ is rendered non-conductive, while in the reading state, a small current of about 0.5 mA is sinked in transistor $Q_4$. Therefore, the collector potential of the transistor $Q_4$ is sustained low, and, as a result, the diode $D_1$ is rendered conductive, whereby the base current of the transistor $Q_2$, which is supplied from the power supply $V_{CC}$ via the resistor $R_1$, is divided into a current of the emitter side and a current of the collector side. Accordingly, the base current supplied to the transistor $Q_3$ is smaller than when information is being written down. Hence, the base current of the transistor $Q_4$ becomes so small as to be sufficient to draw a current of about 0.5 mA from the word line $WL_0$. In general, in the programmable read only memory in which the writing current and the reading current have such greatly different values as 200 mA and 0.5 mA, if the base current of the transistor $Q_4$ is so great as to adequately drive the writing current of 200 mA, then in the reading state the transistor $Q_4$ will be saturated due to excessive base current, and excessive electric charge will accumulate in the base. Therefore, the transistor $Q_4$ takes an extended period of turn off time, and is unsuited for high-speed operation. In order to prevent the above-mentioned inconvenience, therefore, the conventional decoder circuit has been equipped with a feedback circuit which switches the base current of the transistor $Q_4$, so that suitable base currents can be supplied to the transistor $Q_4$ both in writing and reading states. Provision of the feedback circuit, however, makes the circuit setup complicated, and is not desirable from the standpoint of highly integrating the circuits. For example, as will be obvious from FIG. 2, the collector of the transistor $Q_2$ and the collector of the transistor $Q_4$ in the feedback circuit must be connected via the diode $D_1$ over the wiring of the transistor $Q_3$, thus making the wiring complicated. It is of course allowable to switch over the power supply $V_{CC}$ to control the base current of transistor $Q_4$ during writing or reading states, instead of providing the above-mentioned feedback circuit in decoder driver circuit. However, the power supply voltage $V_{CC}$ must feed a voltage not only to the decoder driver circuit but also to other circuits, and thus it is undesirable to switch over the power supply voltage $V_{CC}$ in view of the design requirements of other circuits.

An embodiment of the present invention is described below with reference to FIG. 3.

Figure 3:
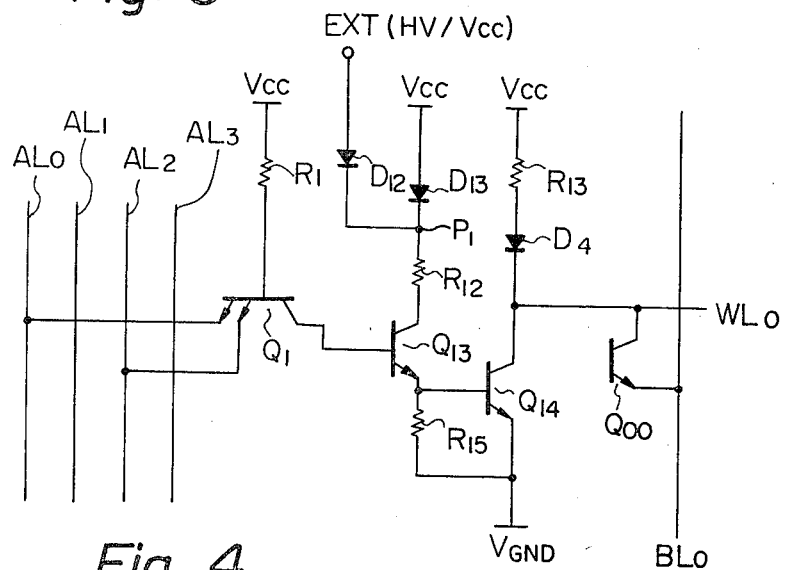
FIG. 3 is a circuit diagram of a semiconductor memory device according to the present invention, and especially a decoder circuit according to an embodiment of the present invention.

FIG. 3 illustrates a decoder driver circuit, address signal line and a word line according to an embodiment of the present invention. The circuit of FIG. 3 is connected to address inverters and a programming circuit as is illustrated in FIG. 2.

The novel features of the circuit of the present invention are described below. In the present invention, the feedback circuit of FIG. 2, which comprises the transistor $Q_2$ and the diode $D_1$, is eliminated, and, instead, an external terminal EXT is connected to the collector of a pre-final transistor $Q_{13}$ to control the base current of the transistor $Q_{14}$ in the final stage.

In writing, a voltage which is greater than the power supply voltage $V_{CC}$ where the power supply voltage is (of, for example, 5 volts) is applied to the terminal EXT, whereby a base current which is great enough to sink a current of about 200 mA from the word line $WL_0$ is fed to the transistor $Q_{14}$ of the final stage via the transistor $Q_{13}$. The diode $D_{13}$ is provided to prevent the current applied from the terminal EXT from flowing to the voltage supply $V_{cc}$.

In reading, on the other hand, an input voltage less than or equal to the supply voltage is applied to the terminal EXT. In this case, however, the transistor $Q_{14}$ is driven by a base current consisting of a current which flows from the power supply $V_{CC}$ via $R_1$ plus $Q_1$ and a current which flows from the power supply $V_{CC}$ through point $P_1$ via $R_{12}$, $D_{13}$, and $Q_{13}$, so that the base current of the transistor $Q_{14}$ is small enough to sink a reading current of about 0.5 mA from the word line $WL_0$. The diode $D_{12}$ is provided to prevent the collector current which is supplied by the supply voltage $V_{cc}$ from blowing to the terminal EXT.

Thus, by supplying a base current from an external unit to the transistor $Q_{14}$ in the final stage, the base current of the transistor can be controlled both in reading and writing states, and thus, the feedback circuit (which requires complicated cross-over wiring, shown in the conventional art can be eliminated. Moreover, by supplying enough base current from the terminal EXT, there is no need of increasing the number of stages to amplify the base current, i.e., the number of stages can be reduced and the circuit can be simplified.

Figure 4:
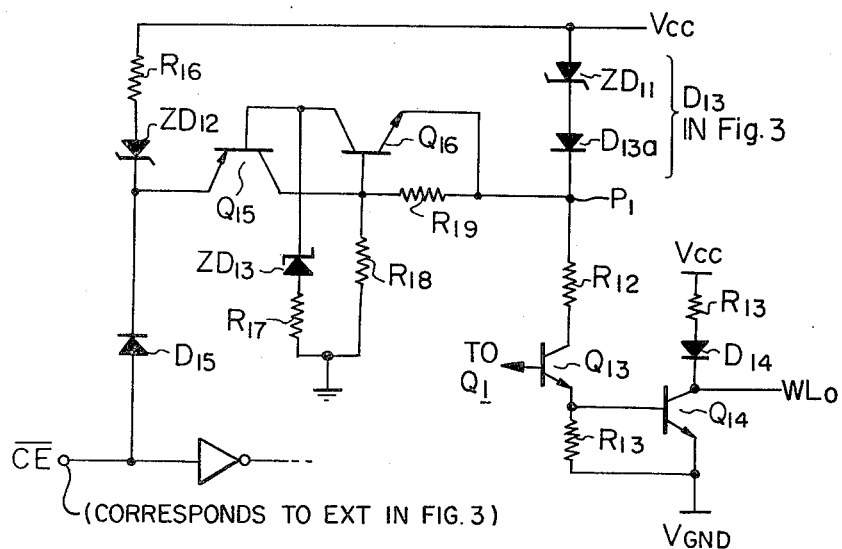
FIG. 4 is a circuit diagram of a circuit for providing a current which feeds driving current to transistors of decoder driver in the semiconductor memory device according to the present invention.

A circuit for supplying the current of the terminal EXT is mentioned below in detail with reference to FIG. 4. As illustrated in FIG. 4, the terminal EXT can be connected to the chip enable input $\overline{CE}$ through a voltage control circuit which consists of a diode $D_{15}$ connected to the terminal $\overline{CE}$, a series circuit consisting of a Zener diode $ZD_{12}$ and a resistor $R_{16}$ connected between the power supply $V_{CC}$ and the diode $ZD_{12}$, a pnp transistor $Q_{15}$ of which the emitter is connected to a connection point between the diode $D_{15}$ and the Zener diode $ZD_{12}$, a series circuit, consisting of a Zener diode $ZD_{13}$ and a resistor $R_{17}$, connected between the base of the transistor $Q_{15}$ and ground, an npn transistor $Q_{16}$ of which the base is connected to the collector of the transistor $Q_{15}$ and of which the collector is connected to the base of the transistor $Q_{15}$, a resistor $R_{19}$ connected between the base and the emitter of transistor $Q_{16}$, and is served with the collector voltage of the transistor $Q_{15}$, a resistor $R_{18}$ (preventing the voltage control circuit from malfunctioning by surge current) which is connected between the base of the transistor $Q_{16}$ and ground, and a series circuit, consisting of a Zener diode $ZD_{11}$ and a diode $D_{132}$, connected between the power supply $V_{CC}$ and a connection point intermediate between the emitter of transistor $Q_{16}$, the resistor $R_{19}$, and the resistor $R_{12}$. In the circuit of FIG. 4, the diode $D_{15}$ works to prevent reverse current flow, the Zener diode $ZD_{12}$ and the resistor $R_{16}$ reduce the input capacitance, the series circuit of the Zener diode $ZD_{13}$ and resistor $R_{17}$ bias the voltage-current characteristics, and the resistor $R_{18}$ prevents the transistors $Q_{15}$ and $Q_{16}$ from being rendered conductive by a surge current.

Referring to the circuit constructed as illustrated in FIG. 4, the transistors $Q_{15}$ and $Q_{16}$ form an SCR replacing $D_{12}$ circuit. The Zener diode $ZD_{13}$ has been connected to the base of the transistor $Q_{15}$. Therefore, when a voltage greater than the reference voltage of the Zener diode $ZD_{13}$ is applied to the terminal $\overline{CE}$, the transistor $Q_{15}$ is rendered conductive and a collector current flows. As the collector current flows into the transistor $Q_{15}$, the base potential of the transistor $Q_{16}$ is, and the transistor $Q_{16}$ is rendered conductive. Accordingly, the transistor $Q_{13}$ supplies a base current to the transistor $Q_{14}$ such that it will be capable of sinking a write current of about 200 mA. In FIG. 4, a series circuit consisting of the Zener diode $ZD_{11}$ and the diode $D_{13a}$ is equivalent to the diode $D_{13}$ to FIG. 3.

According to the present invention, described in the foregoing, the decoder circuit does not require a feedback circuit for switching over the base current of the transistor in the final stage from reading to writing state and vice versa. Therefore, the circuit setup and wiring can be simplified and the mask for manufacturing the device can be simplified too, making it possible to form a semiconductor memory device having a high degree of integration.

Although the chip enable terminal was also used as the external terminal EXT in the aforementioned embodiment, it is also allowable to employ an address input terminal upon which can be impressed a voltage (of, for example, 20 volts) which is greater than that of the power supply $V_{CC}$.

We claim:

1. A semiconductor memory device for writing or reading information in selected memory cells in dependence upon a write or read status, comprising:
    an address buffer which receives address signals and generates outputs accordingly;
    address signal lines, levels of which are set by the outputs of said address buffer, generating outputs;
    a decoder circuit for decoding the outputs of said address signal line, said decoder circuit comprising:
        a decoding transistor connected to said address signal lines;
        a first transistor having a base connected to said decoding transistor, an emitter and a collector;
        a second transistor having a base connected to said emitter of said first transistor and an emitter connected to ground, and producing a first current; and
        a resistor connected to said collector of said first transistor;
    memory cells, connected to said second transistor, which will be rendered selectively conductive or non-conductive in accordance with write information, the conductive or non-conductive state of said memory cells being rendered in dependence upon the first current; and
    means, operatively connected to said resistor, for sensing the read and write status and for producing a control current in said first transistor of said decoder circuit of a higher value when writing information into a selected memory cell than when reading, the control current in said first transistor controlling generation of said first current.

2. A semiconductor memory device according to claim 1, further comprising:
    a terminal connected to said first transistor and to which said means for producing is connected when information is both read out from and written into the memory cells; and
    a signal source, connected to said terminal, for generating a current signal having a lower value than that produced by said means for producing when information is to be read out from said memory cell.

3. A semiconductor memory device according to claim 2, wherein said means for producing comprises:
    a third transistor having a base and a collector and having an emitter connected to said terminal;
    a first series circuit, consisting of a reference-voltage diode and a first resistor, connected between the collector of said third transistor and ground;
    a fourth transistor, having a base connected to the collector of said third transistor, having an emitter, and having a collector connected to the base of said third transistor;
    a second resistor connected between the base and the emitter of said third transistor; and
    a third resistor for preventing surge current, said third resistor being connected between the base of said third transistor and ground.

4. A semiconductor memory device according to claim 3, wherein said memory device includes a chip enable terminal, and wherein said means for producing further comprises:
    a first diode for preventing the reversal of current flow, connected between said chip enable terminal and said fourth transistor, and
    a second series circuit, comprising a fourth resistor and a second diode, connected between a power supply terminal and said fourth transistor.

5. A semiconductor memory device according to claim 2, wherein said semiconductor memory device is operatively connected to receive a chip enable signal, and wherein said means for producing is controlled by the chip enable signal.

6. A PROM address decoder, operatively connected to a power supply, for driving a word line in accordance with address signals received, and for selectively driving said word line, if said word line is driven, at a high or low word line current in accordance with a write or read status respectively, said decoder comprising:

- a first transistor, comprising a base for controlling the word line current, a collector connected to the word line, and an emitter connected to ground;
- a second transistor, comprising an emitter, a base, and collector, said emitter of said second transistor being connected to said base of said first transistor;
- means, operatively connected to the base of said second transistor, for controlling the base current of said second transistor in accordance with the address signals received; and
- means, operatively connected to the collector of said second transistor, for applying a first potential and for sensing and applying a second higher potential to said collector of said second transistor, in accordance with the read or write status respectively, the base current of said first transistor being changed by said means for sensing and applying, so that the word line current is controlled in accordance with the read or write status and the address signals.

7. The decoder of claim 6, wherein said means for sensing and applying the first and second potential comprises:

- a first resistor connected to said collector of said second transistor;
- a first diode, connected between said first resistor and the power supply, for supplying the first potential; and
- means, operatively connected to said first resistor, for supplying the second potential.

8. The decoder of claim 7, wherein said means for supplying comprises:

- a third transistor comprising a base, an emitter, and a collector, said emitter being connected to said first resistor;
- a second resistor connected between said base and said emitter of said third transistor;
- a fourth transistor comprising a base connected to said collector of said third transistor, a collector connected to said base of said third transistor and an emitter; and
- a second diode connected to said emitter of said fourth transistor.

9. The decoder of claim 8, wherein said means for supplying further comprises bias means for biasing connected between said base of said fourth transistor and ground.

10. The decoder of claim 9, wherein said bias means comprises a third diode and a third resistor connected in series.

11. The decoder of claim 10, wherein said means for supplying further comprises:

- a fourth diode connected to said emitter of said fourth transistor; and
- a fourth resistor connected between said fourth diode and the power supply.

12. The decoder of claim 11, wherein said means for controlling said base of said second transistor comprises:

- a multi-emitter transistor, said multi-emitter transistor comprising a plurality of emitters adapted to receive the address signals, a base, and a collector connected to the base of said second transistor; and
- a fifth resistor, connected between the power supply and said base of said multi-emitter transistor.

13. The decoder of claim 12, wherein said means for supplying further comprises a sixth resistor connected between said base of said third transistor and ground.

14. The decoder of claim 13, wherein a voltage of approximately 20 volts is selectively applied to said second diode.

15. The decoder of claim 13, further comprising a chip enable terminal connected to said second diode.

16. The decoder of claim 13, further comprising an address input terminal connected to said second diode.

17. A PROM memory device having a selectable read of write status, comprising:

- a plurality of word lines;
- a plurality of bit lines;
- a plurality of memory cells, each of said memory cells being connected to one of said word lines and to one of said bit lines;
- a plurality of address terminals;
- a plurality of data terminals;
- a programming circuit connected to each of said bit lines and to each of said data terminals;
- a multiplexer connected to each of said bit lines and to each of said data terminals;
- address buffer means, connected to said data terminals and to said multiplexer and said programming circuit, for providing outputs in accordance with the signals received at said data terminals; and
- address decoder means, operatively connected to said address buffer and means to said word lines, for driving a particular one of said word lines selected in accordance with said outputs of said address buffer means, and for sensing the write and read status and driving said particular word line at a high or low word line current in accordance with the write or read status respectively, said address decoder comprising a first transistor, connected to said particular word line and ground, for controlling the word line current, said first transistor being controlled by a base current in dependence upon the read or write status and the selection of said particular word line.

18. The device of claim 17, wherein said first transistor, comprising a base, a collector connected to one of said word lines, and an emitter connected to ground, and said address decoder further comprising:

- a second transistor, comprising an emitter, a base, and a collector, said emitter of said second transistor being connected to said base of said first transistor;
- means, operatively connected to said base of said second transistor, for controlling the base current base of said second transistor in accordance with the address signals received; and
- means, operatively connected to said collector of said second transistor, for applying a first potential and for sensing and applying a second higher potential to said collector of said second transistor in accordance with the read or write status respectively, said first or second potential controlling the base current of said first transistor, so that the one of the word lines is driven by the high or low word line current in dependence upon the read or write status and the address signals.

* * * * *

UNITED STATES PATENT AND TRADEMARK OFFICE
CERTIFICATE OF CORRECTION

PATENT NO. : 4,424,582

DATED : JANUARY 3, 1984

INVENTOR(S) : TOSHITAKA FUKUSHIMA ET AL.

It is certified that error appears in the above-identified patent and that said Letters Patent is hereby corrected as shown below:

FRONT PAGE [73] Assignee, "Kanagawa" should be --Kawasaki--.

Col. 1, line 11, "only)" should be --only--;
"memory" should be --memory)--;
line 32, after "current" insert --levels--.

Col. 3, line 42, after "$Q_4$," insert --the--.

Col. 4, line 35, "where" should be --(where--;
line 36, delete "(";
line 47, "plus" should be --and--;
"and" should be --plus--;
line 54, "blowing" should be --flowing--;
line 59, "wiring," should be --wiring)--.

Col. 5, line 37, "is," should be --is raised,--;
line 40, "it" should be --$Q_{14}$--.

Signed and Sealed this

Seventh Day of August 1984

[SEAL]

Attest:

GERALD J. MOSSINGHOFF

Attesting Officer   Commissioner of Patents and Trademarks